(12) United States Patent
Lin et al.

(10) Patent No.: US 12,027,205 B2
(45) Date of Patent: Jul. 2, 2024

(54) RESISTIVE MEMORY WITH LOW VOLTAGE OPERATION

(71) Applicant: Taiwan Semiconductor Manufacturing Company, Ltd., Hsinchu (TW)

(72) Inventors: Zheng-Jun Lin, Taichung (TW); Chung-Cheng Chou, Hsinchu (TW); Yu-Der Chih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 101 days.

(21) Appl. No.: 17/828,979

(22) Filed: May 31, 2022

(65) Prior Publication Data

US 2023/0207005 A1    Jun. 29, 2023

Related U.S. Application Data

(60) Provisional application No. 63/294,721, filed on Dec. 29, 2021.

(51) Int. Cl.
  *G11C 13/00*    (2006.01)

(52) U.S. Cl.
  CPC ...... *G11C 13/0069* (2013.01); *G11C 13/0026* (2013.01); *G11C 13/0033* (2013.01); *G11C 2213/79* (2013.01)

(58) Field of Classification Search
  CPC ............................ G11C 13/00; G11C 13/0069
  USPC .......................................................... 365/148
  See application file for complete search history.

(56) References Cited

U.S. PATENT DOCUMENTS

| | | | |
|---|---|---|---|
| 2011/0235402 A1* | 9/2011 | Ueda | G11C 11/1657 365/158 |
| 2013/0021836 A1 | 1/2013 | Liu | |
| 2013/0279275 A1* | 10/2013 | Chae | G11C 11/4094 365/189.011 |
| 2020/0243135 A1* | 7/2020 | Chou | G11C 13/0026 |
| 2022/0139429 A1* | 5/2022 | Lee | G11C 7/10 365/207 |

* cited by examiner

*Primary Examiner* — Muna A Techane
(74) *Attorney, Agent, or Firm* — Merchant & Gould P.C.

(57) ABSTRACT

A memory device includes RRAM memory cells configured to form a zero-transistor and one-resistor (0T1R) array structure in which access transistors of the RRAM memory cells are bypassed or removed. Alternatively, the access transistors of the RRAM memory cells may be arranged in a parallel structure to reduce associated IR drop and thus enable reduced write voltage operation.

20 Claims, 10 Drawing Sheets

RESISTIVE MEMORY WITH LOW VOLTAGE OPERATION

CROSS REFERENCE TO RELATED APPLICATION

This application claims the benefit of U.S. Provisional Patent Application No. 63/294,721, filed on Dec. 29, 2021, the contents of which is incorporated by reference.

BACKGROUND

Resistive Random Access Memory (RRAM) is a memory technology that uses a change in resistance rather than charge to store bits of information. The resistive switching in RRAM is carried out by SET and RESET operations. In a typical RRAM device, a high write voltage is required to perform a SET due to large current and high IR drop along a bit line/select line (BL/SL) and a selector device. A charge pump is thus typically used to provide a high write voltage. The RRAM device may also adopt high voltage (HV) devices in the mux design for reliability criteria. As a result, the RRAM device may be inhibited by higher write power consumption, higher area overhead, and difficulty shrinking logic with the incorporation of the charge pump and HV devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some disclosed embodiments herein relate to systems and/or methods for achieving low voltage operations for a memory architecture such as Resistive Random Access Memory (RRAM). In one embodiment, the selector device or transistor of each memory cell is bypassed or removed, thus eliminating its associated IR drop and reducing the minimum voltage for performing a write operation. Advantageously, the memory architecture can achieve a non-charge pump design and/or eliminate HV devices to reduce area overhead and logic processes.

Figure 1A:
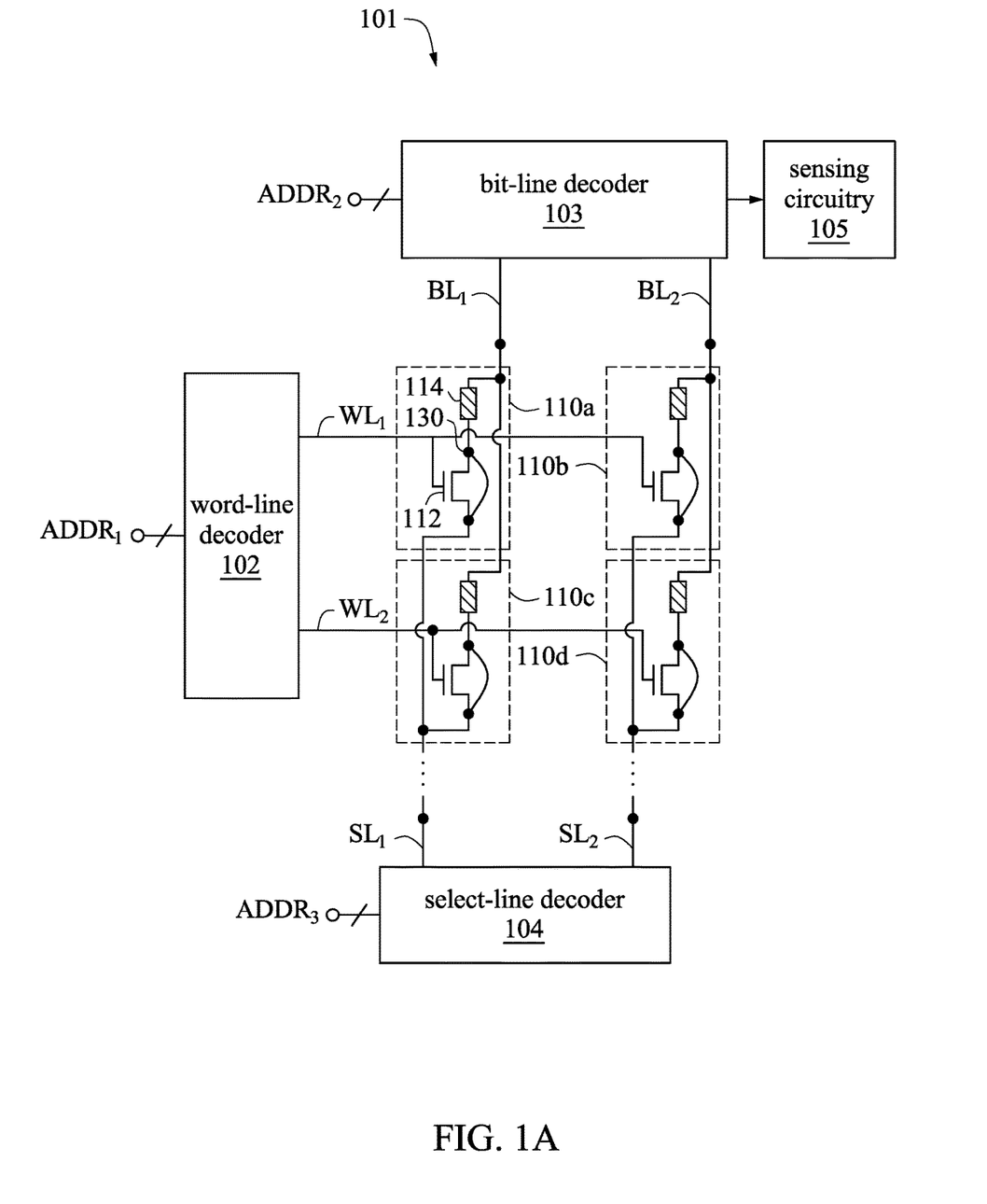
FIG. 1A is a block diagram of a memory device in accordance with some embodiments.

FIG. 1A is a block diagram of a memory device 101 in accordance with some embodiments. The memory device 101 includes one or more memory cell arrays 100 made up of memory cells 110. In some examples, the memory cells 110 are RRAM memory cells, which are discussed further below. A row of memory cells 110 (e.g., memory cells 110a-110b or 110c-110d) are operably coupled to a word-line $WL_1$ or $WL_2$, respectively, while a column of memory cells 110 (e.g., 110a-110c or 110b-110d) are operably coupled to a bit line $BL_1$ or $BL_2$ and a select line $SL_1$ or $SL_2$, respectively. The memory cells 110 are respectively associated with an address which may be defined by an intersection of a word line $WL_1$ or $WL_2$ and a bit line $BL_1$ or $BL_2$ and/or a select line $SL_1$ or $SL_2$.

The memory cell array 100 may be coupled to support circuitry that is configured to read data from and/or write data to the memory cells 110. In some embodiments, the support circuitry comprises a word line decoder 102, a bit line decoder 103, a select line decoder 104, and/or sensing circuitry 105. The word line decoder 102 is configured to selectively apply a signal (e.g., a current and/or voltage) to one of the word lines $WL_1$-$WL_2$ based upon a first address ADDR1, the bit line decoder 103 is configured to selectively apply a signal to one of the plurality of bit lines $BL_1$-$BL_2$ based upon a second address ADDR2, and the select line decoder 104 is configured to selectively apply a signal to one of the plurality of select-lines $SL_1$-$SL_2$ based upon a third address ADDR3. In some embodiments, the second address ADDR2 and the third address ADDR3 may be a same address.

The memory cells 110 may comprise RRAM cells having variable resistive elements to store bits of data. In a typical one-transistor and one-resistor (1T1R) RRAM array, each memory cell 110 may include one access transistor 112 and one RRAM resistive element 114. The RRAM resistive element 114 has a resistive state that is switchable between a low resistive state and a high resistive state to indicate a data value (e.g., a "1" or "0") stored within the RRAM resistive element 114. As described in greater detail below, according to some aspects of the disclosure, the access transistors 112 of the memory cells 110 are bypassed with a conductive element such as metal wiring 130 to reduce the minimum voltage for performing a write operation. Although a single access transistor 112, RRAM resistive element 114, and metal wiring 130 are shown with respect to a single memory cell 110a in FIG. 1A for ease of illustration, it will be appreciated the concept is applicable to multiple or all memory cells 110 of the memory device 101.

Figure 1B:
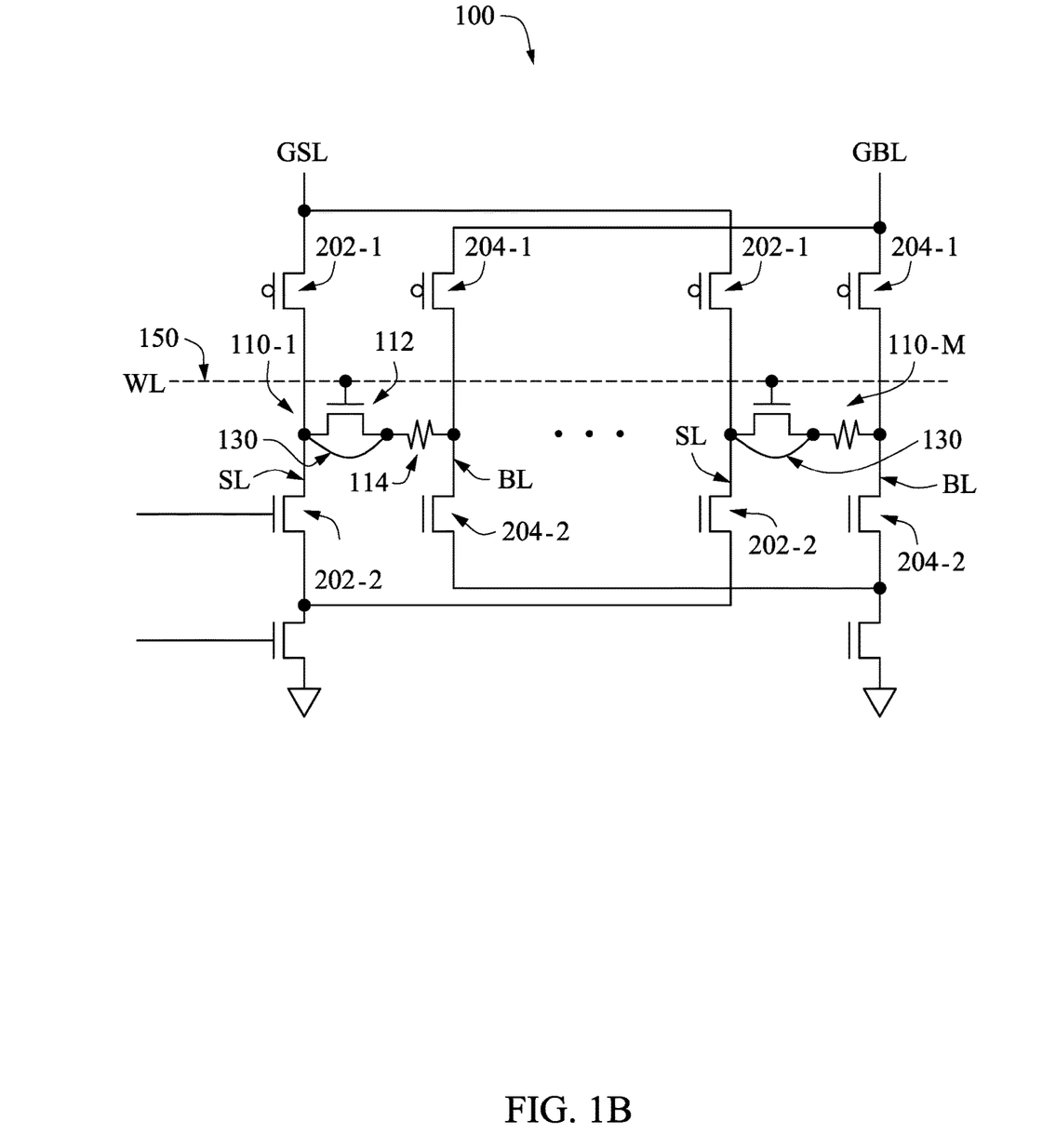
FIG. 1B is a diagram of an example memory cell array for a memory device in accordance with some embodiments.

FIG. 1B is a diagram of a portion of the example memory cell array 100 for a memory device in accordance with some embodiments. As noted in conjunction with FIG. 1A, the memory cell array 100 includes a grid of memory cells 110 arranged in rows and/or columns (one row with one memory cell 110 in each column 1-M is shown in FIG. 1B for ease of illustration and explanation).

Resistive switching in RRAM is carried out by write operations called set and reset operations. For example, a "set" voltage may be applied to a memory cell 110 to change the variable resistance dielectric layer from a first resistivity (e.g., a high resistance state (HRS) corresponding with logic "0") to a second resistivity (e.g., a low resistance state (LRS) corresponding with logic "1"). Similarly, a "reset" voltage may be applied to the memory cell 110 to change the variable resistance dielectric layer from the second resistivity back to the first resistivity. Each memory cell 110 may operate as a three-terminal device including a bit line (BL), select line or source line (SL), and word line (WL). The memory cell array 100 includes column select transistors 202/204 to switch or connect the local BL or SL to a global bit line (GBL) or source line (GSL) to connect a selected memory cell 110 to write circuitry (e.g., described with respect to FIG. 2). Current memory devices incorporate a charge pump to provide a voltage sufficiently high for performing write operations, and also incorporate high voltage devices in the multiplexer or logic to reliably handle high voltage write signals.

Accordingly, in one embodiment, the memory cell array 100 is configured to bypass the access transistor 112 of the memory cells 110, effectively removing it from the memory cell. In some examples, a conductive element such as metal wiring 130 may connect the source/drain terminals of each access transistor 112 to bypass the access transistor 112, thus forming a zero-transistor and one-resistor (0T1R) RRAM array. Other conductive elements connecting the source/drain terminals of each access transistor 112 are within the scope of the disclosure. Advantageously, IR drop associated with the access transistor 112 during a write operation is eliminated, thus reducing the minimum voltage for performing writes and also reducing area overhead without changes to the front-end device. Alternatively or additionally, the access transistors 112, word line (WL), and/or WL driver circuitry may be removed, as generally indicated by dashed line 150, to further reduce area overhead. For example, with respect to FIG. 1A, this may represent removal of one or more word lines (e.g., $WL_1$, $WL_2$, etc.) and/or word line decoder 102 (or components thereof such as charge pump and/or high voltage devices in the mux design).

Figures 1C, 1D:
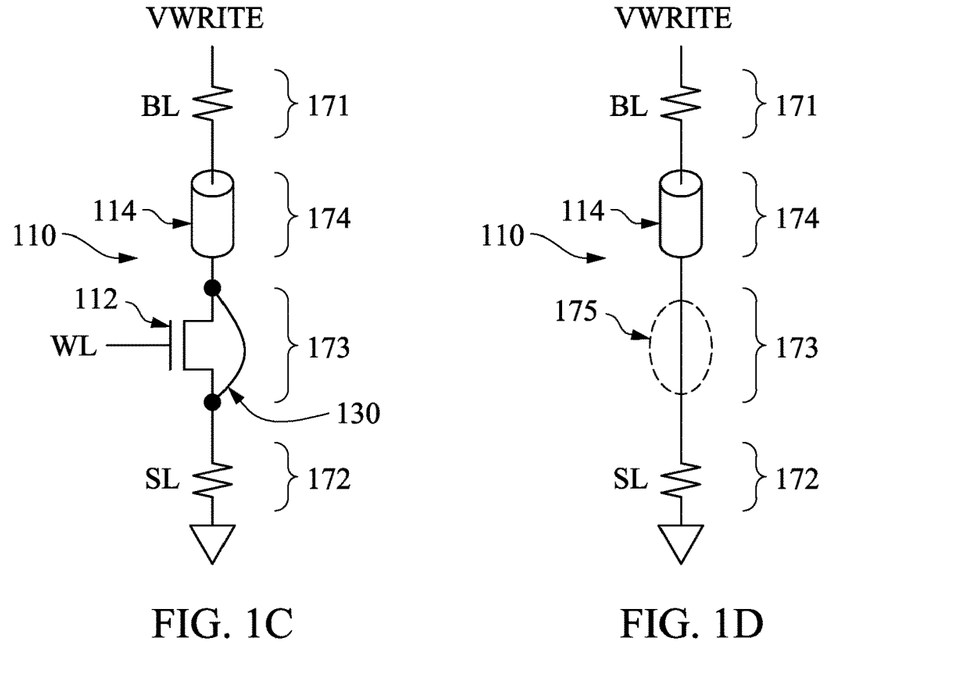
FIG. 1C is a schematic diagram of a write path for a memory cell in accordance with some embodiments.
FIG. 1D is another schematic diagram of a write path for a memory cell in accordance with some embodiments.
Figure 1E:
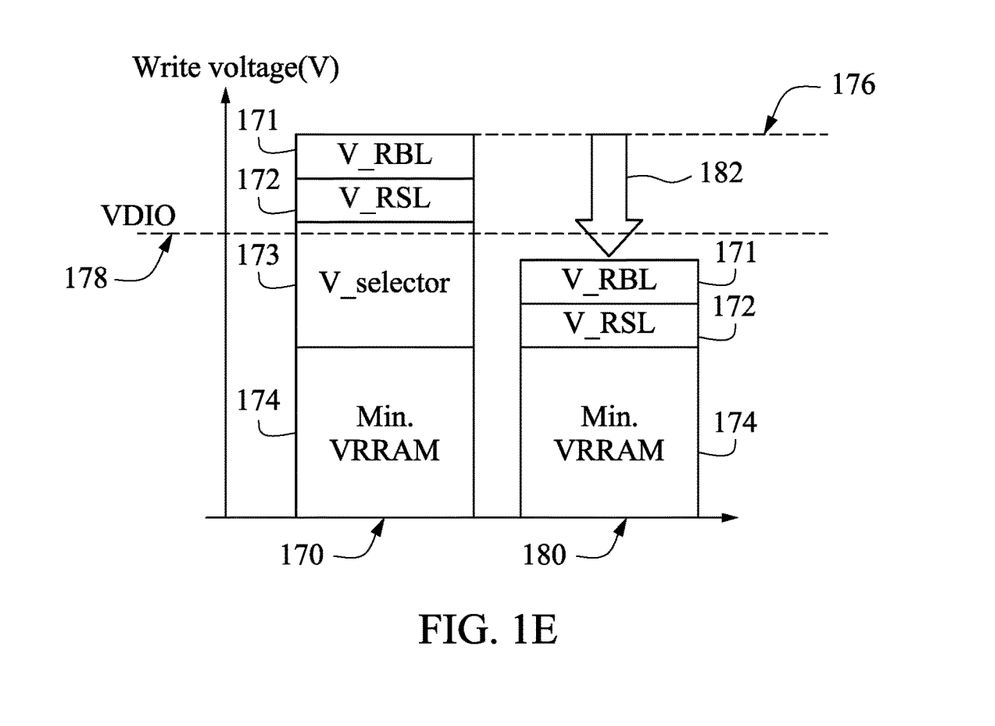
FIG. 1E is a graph illustrating a write operation voltage for a memory cell in accordance with some embodiments.

FIG. 1C is a schematic diagram of a write path for a memory cell 110 in accordance with some embodiments. FIG. 1D is another schematic diagram of a write path for a memory cell 110 in accordance with some embodiments. FIG. 1E is a graph illustrating a write operation voltage for a memory cell 110 in accordance with some embodiments. As shown by bar graph 170 of FIG. 1E, a conventional write voltage VWRITE may take into account four voltages: a first voltage (V_RBL) 171 associated with the bit line (BL), a second voltage (V_RSL) 172 associated with the source line (SL), a third voltage (V_selector) 173 associated with the access transistor 112, and a fourth voltage (VRRAM) 174 associated with a minimum voltage for changing resistivity of the RRAM resistive element 114. As a result, the minimum write voltage VWRITE, indicated by dashed line 176, may be higher than a supply voltage (VDIO) (see FIG. 2) represented by dashed line 178. Conventional resistive memory devices therefore incorporate charge pumps and high voltage devices to provide and handle a high write voltage.

By contrast, by incorporating the metal wiring 130 to bypass the access transistor 112 (e.g., as shown in FIG. 1C), IR drop of the third voltage (V_selector) 173 is eliminated, enabling the minimum operation voltage 178 (e.g., shown in FIG. 1E) of the memory device to be reduced. Since the metal wiring 130 effectively removes the access transistor 112 from the circuit, there is also no need for the word line WL so it could optionally be removed as indicated by the broken line 150 in FIG. 1B. Alternatively or additionally, as shown in FIG. 1D, a similar result may be obtained by removing the access transistor 112 as indicated by dashed circle 175 such that the RRAM resistive element 114 is directly connected between BL/SL (e.g., having no intermediary device such as an access transistor 112 between the RRAM resistive element 114 and either of the BL or SL). As shown by bar graph 180 of FIG. 1E, the write voltage (e.g., VWRITE in FIGS. 1B and 1C) is able to be decreased to a level below the supply voltage VDIO 178 as shown by arrow 182. In addition to the technical benefits associated with eliminating the charge pump and high voltage devices in associated support circuitry (e.g. word line decoder 102, bit line decoder 103, select line decoder 104, sensing circuitry 105, etc. shown in FIG. 1A), the 0T1R RRAM architecture described herein may provide a comprehensive test structure for element characterization of the RRAM resistive elements 114 of the memory cell array 100. Additionally, the fast operation and low power capabilities are advantageous for particular applications such as electronic fuse applications. The circuits of FIG. 1C-D show how the reduced voltage can be achieved and do not show the conventional minimum operational voltage. Additionally, note that while the WL may be removed it does not have to be removed in some embodiments.

Figure 2:
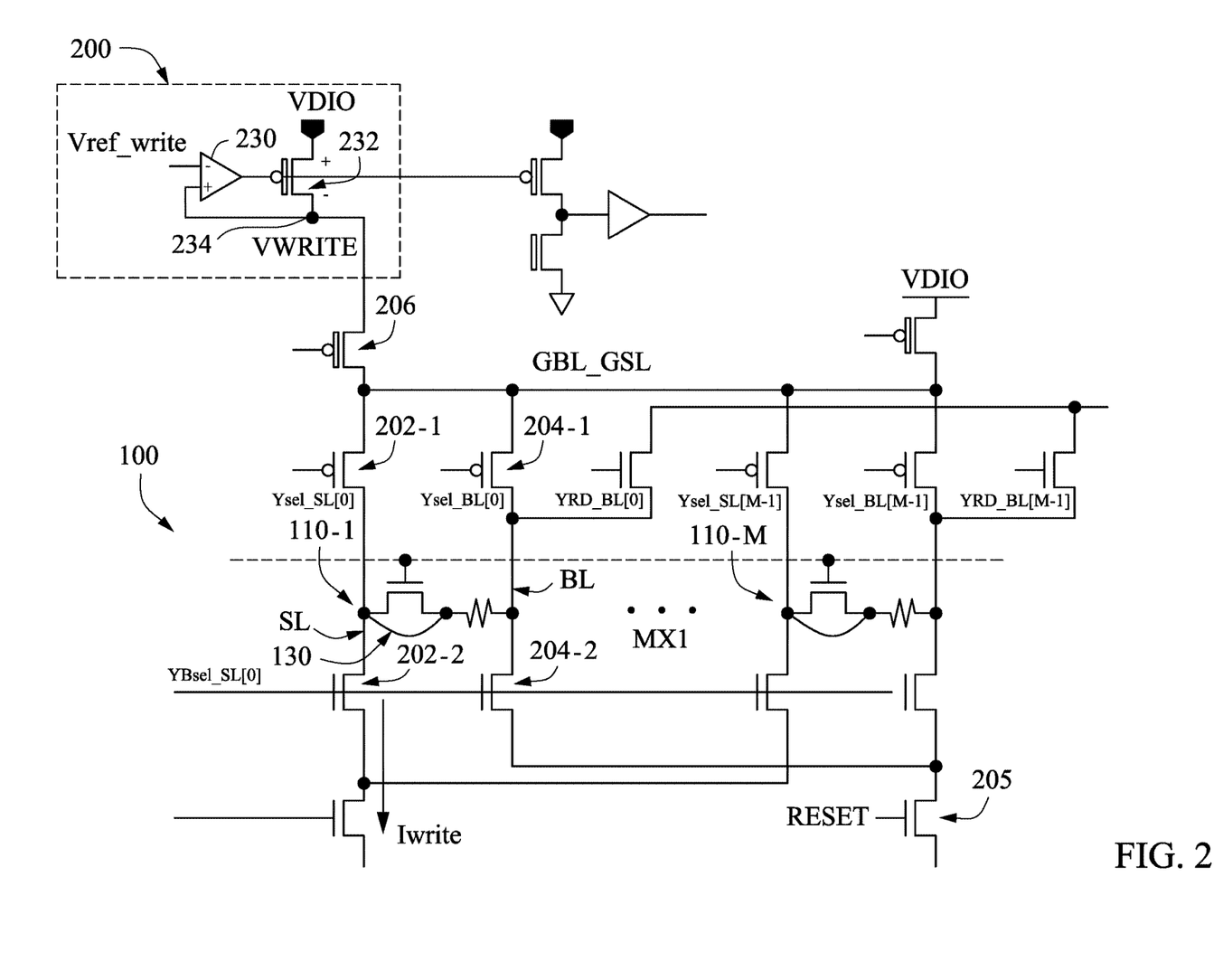
FIG. 2 illustrates an example regulated write voltage circuit for the memory cell array in accordance with some embodiments.

FIG. 2 illustrates an example regulated write voltage circuit 200 configured to output the VWRITE voltage for a memory cell array such as the memory cell array 100 shown in FIGS. 1A and 1B in accordance with some embodiments. The regulated write voltage circuit 200 may be implemented with the memory cell array 100 in which access transistors 112 are bypassed via metal wiring 130 (e.g. FIG. 1C) or removed (e.g. FIG. 1D) to form a 0T1R array capable of low voltage operation. As shown in FIG. 2, each memory cell 110 of a given row of M cells may receive a write operation (e.g., SET/RESET) via signals Ysel_SL/Ysel_BL sent to the gates of the column select transistors 202/204 and RESET signals sent to a reset transistor 205 of the appropriate column.

In one embodiment, a first terminal of the memory cell 110 connects to a source line (SL) between a first SL select transistor 202-1 and a second SL select transistor 202-2, and a second terminal of the memory cell 110 connects to a bit line (BL) between a first BL select transistor 204-1 and a second BL select transistor 204-2. That is, a first pair of select transistors 202-1/204-1 may comprise PMOS transistors connected between a global/source bit line(s) (GBL/GSL) and the memory cell 110, and a second pair of select transistors 202-2/204-2 may comprise NMOS transistors connected between the memory cell 110 and ground. The first pair of select transistors 202-1/204-1 may connect with a write select transistor 206 via respective source/drain (S/D) terminals.

The regulated write voltage circuit 200 is configured to provide a write voltage VWRITE and corresponding write current Iwrite to the memory array 100 via the write select transistor 206. The regulated write voltage circuit 200 includes an operational amplifier (op amp) 230 and write drive transistor 232 (e.g., PMOS) arranged in a closed loop. A first input (e.g., inverting input) of op amp 230 receives a reference voltage Vref_write from I/O circuitry (not shown). An output of op amp 230 is coupled to a gate of the write drive transistor 232. The write drive transistor 232 includes a first S/D terminal connected to a power supply (VDIO) and a second S/D terminal connected, via node 234, to the second input (e.g., non-inverting input) of op amp 230 to form the closed loop. The node 234 also connects the second S/D terminal of the write drive transistor 232 to an S/D terminal of the write select transistor 206.

Accordingly, op amp 230 outputs a gate voltage to the gate of the write drive transistor 232 based upon a value of reference voltage Vref_write, causing the regulated write voltage circuit 200 to output a write voltage VWRITE to a selected memory cell 110. Due to the positive feedback loop, if VWRITE is lower than Vref_write, the op amp 230 output saturates toward the negative supply rail (e.g., ground), turning on the write drive transistor 232 to provide a VWRITE equal to or based on the power supply VDIO. Otherwise, if VWRITE is higher than Vref_write, the op amp 230 output saturates toward the positive supply rail, turning off the write drive transistor 232 to decrease VWRITE. The regulated write voltage circuit 200 is thus advantageously configured to provide a stable write voltage over a wide range of power supply voltage VDIO for the low voltage RRAM structure previously described. That is, the regulated write voltage circuit 200 may prevent stressing the RRAM resistive element 114 of the selected memory cell 110 if VWRITE is equal to the power supply VDIO and the power supply VDIO is excessively high. The write voltage VWRITE output by the regulated write voltage circuit 200 is applied to appropriate source lines SL and/or bit lines BL of the array 100 based on the corresponding Ysel_BL and Ysel-SL signals at the gate terminals of the transistors 202, 204.

Figure 3:
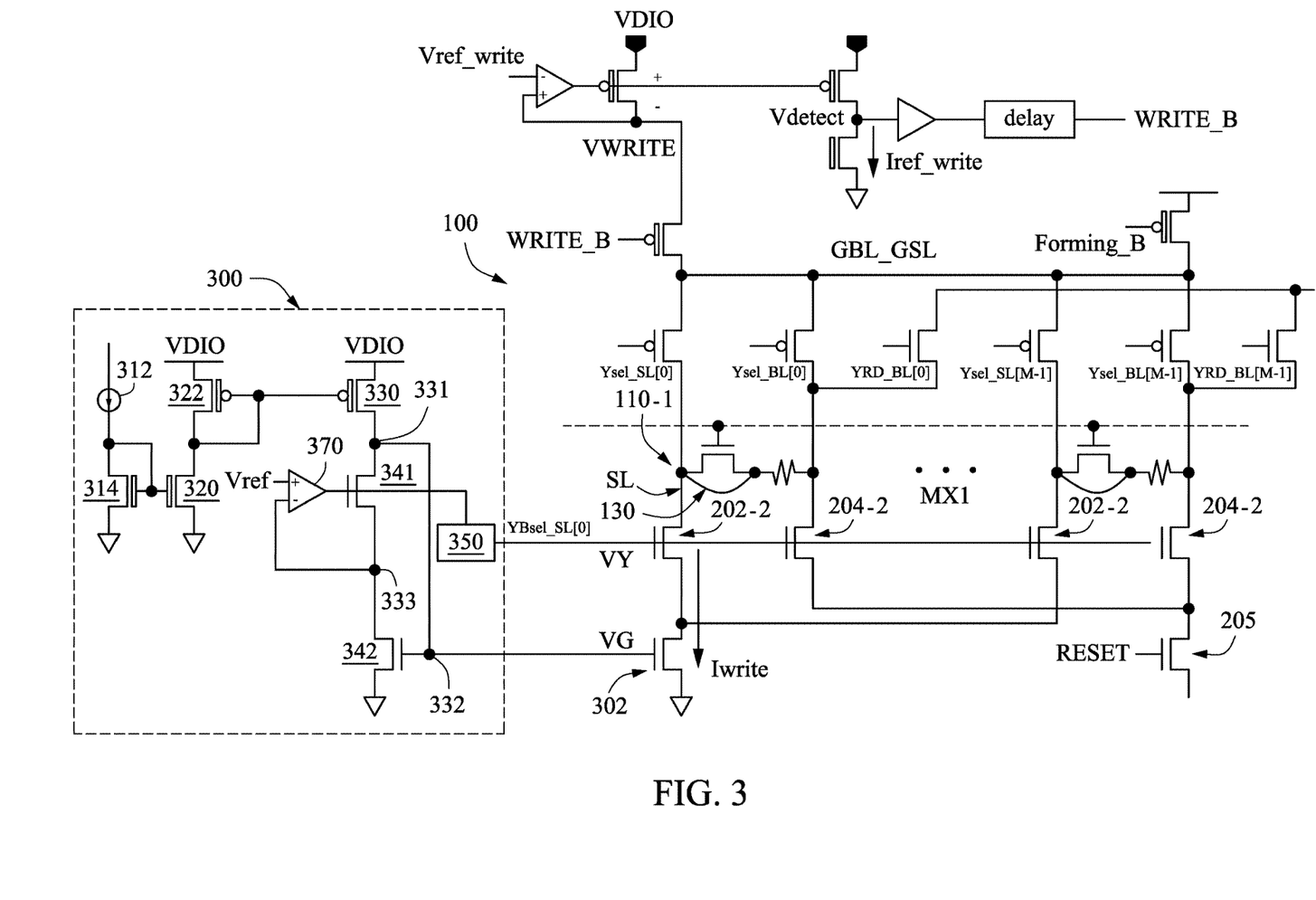
FIG. 3 illustrates an example low voltage current limiter circuit for the memory cell array in accordance with some embodiments.

FIG. 3 illustrates an example low voltage current limiter circuit 300 for the memory cell array 100 in accordance with some embodiments. As described in greater detail below, the low voltage current limiter circuit 300 is configured to operate the second SL select transistor 202-2 and the bottom transistor 302 to write a RRAM resistive element 114 to a stable state while preventing over-SET. The low voltage current limiter circuit 300 may be implemented with the memory cell array 100 in which access transistors 112 are bypassed via metal wiring 130 or removed to form a 0T1R array capable of low voltage operation as previously described. As shown in FIG. 3, a write current Iwrite flows from a memory cell 110 to the second SL select transistor 202-2 and then to a bottom transistor 302 as it travels toward ground.

The low voltage current limiter circuit 300 includes a current source 312 configured to provide a reference current to a diode-connected first transistor 314 (e.g., NMOS). In particular, the first transistor 314 includes a first S/D terminal connected to the current source 312, a second S/D terminal connected to ground, and a gate which is connected to its first S/D terminal and also connected to the gate of a second transistor 320 (e.g., NMOS) to form a current mirror circuit. The second transistor 320 includes a first S/D terminal connected to ground, and a second S/D terminal connected to a first S/D terminal of a diode-connected third transistor 322 (e.g., PMOS).

The third transistor 322 includes a second S/D terminal connected to a power supply VDIO, and a gate which is connected to its first S/D terminal and also connected to the gate of a fourth transistor 330 (e.g., PMOS) to form a current mirror circuit. The fourth transistor 330 includes a first S/D terminal connected to a power supply VDIO and a second S/D terminal connected to a first node 331. The reference current provided by the current source 312 is thus mirrored at the first node 331. The first node 331 connects to a first S/D terminal of a fifth transistor 341 (e.g., NMOS). The first node 331 also connects, via a second node 332, to a gate of the bottom transistor 302 to prevent over-SET by the write current Iwrite as described below.

The fifth transistor 341 is arranged in a closed loop with an op amp 370. In particular, a first input (e.g., non-inverting input) of op amp 370 receives a reference voltage Vref from I/O circuitry (not shown). The output of op amp 370 is connected to the gate of the fifth transistor 341. The output of op amp 370 is also connected to a buffer 350 to route its output voltage VY to the gates of the second SL select transistor(s) 202-2 of the memory cell array 100. For example, for a selected column 1-M, the voltage applied to the gate of its corresponding second SL select transistor 202-2 is equal to the output voltage of the op amp 370. Each second SL select transistor 202-2 is connected in series with the bottom transistor 302 of the memory cell array 100 previously described. The fifth transistor 341 includes a second S/D terminal connected, via a third node 333, to the second input (e.g., inverting input) of op amp 370 to form the closed loop.

The third node 333 also connects the second S/D terminal of the fifth transistor 341 to a first S/D terminal of a sixth transistor 342 (e.g., NMOS). The sixth transistor 342 includes a second S/D terminal connected to ground and a gate connected to the second node 332 and the bottom transistor 302. Thus, a closed loop connection is formed between the gates of both the sixth transistor 342 and the bottom transistor 302 to the first S/D terminal of the fifth transistor 341, causing the current flowing through the bottom transistor 302 to mirror the current flowing through the sixth transistor 342.

Due to the negative feedback loop, voltage at the third node 333 follows Vref, and the drain-source voltage of both the sixth transistor 342 and the mirrored bottom transistor 302 follow Vref as well. Op amp 370 is thus configured to adjust the gate voltage VG of the bottom transistor 302 to limit the write current Iwrite. That is, Vref is chosen to provide a voltage bias, VG, to the gate of the bottom transistor 302 in order to operate the bottom transistor 302 in a saturation region. As such, the bottom transistor 302 acts as a variable resistor and limits the current allowed to flow along the source line SL during a SET operation. For example, for a Vref of 0.1V, the write current gradually saturates after the 0.1V voltage level is reached, thus writing the RRAM resistive element 114 to a stable state while preventing over-SET and also limiting increase in write bias due to the head room overhead of approximately 0.1V. In some embodiments, the low voltage current limiter circuit 300 is global and configured to generate the gate voltage VG and output voltage VY for all of the columns of the memory cell array 100. For ease of illustration and explanation, FIG. 3 shows one row with one memory cell 110 in each column 1-M, though it will be appreciated that a plurality of rows and a plurality of memory cells 100 in each column 1-M may be present as shown in FIG. 1A.

Figure 4:
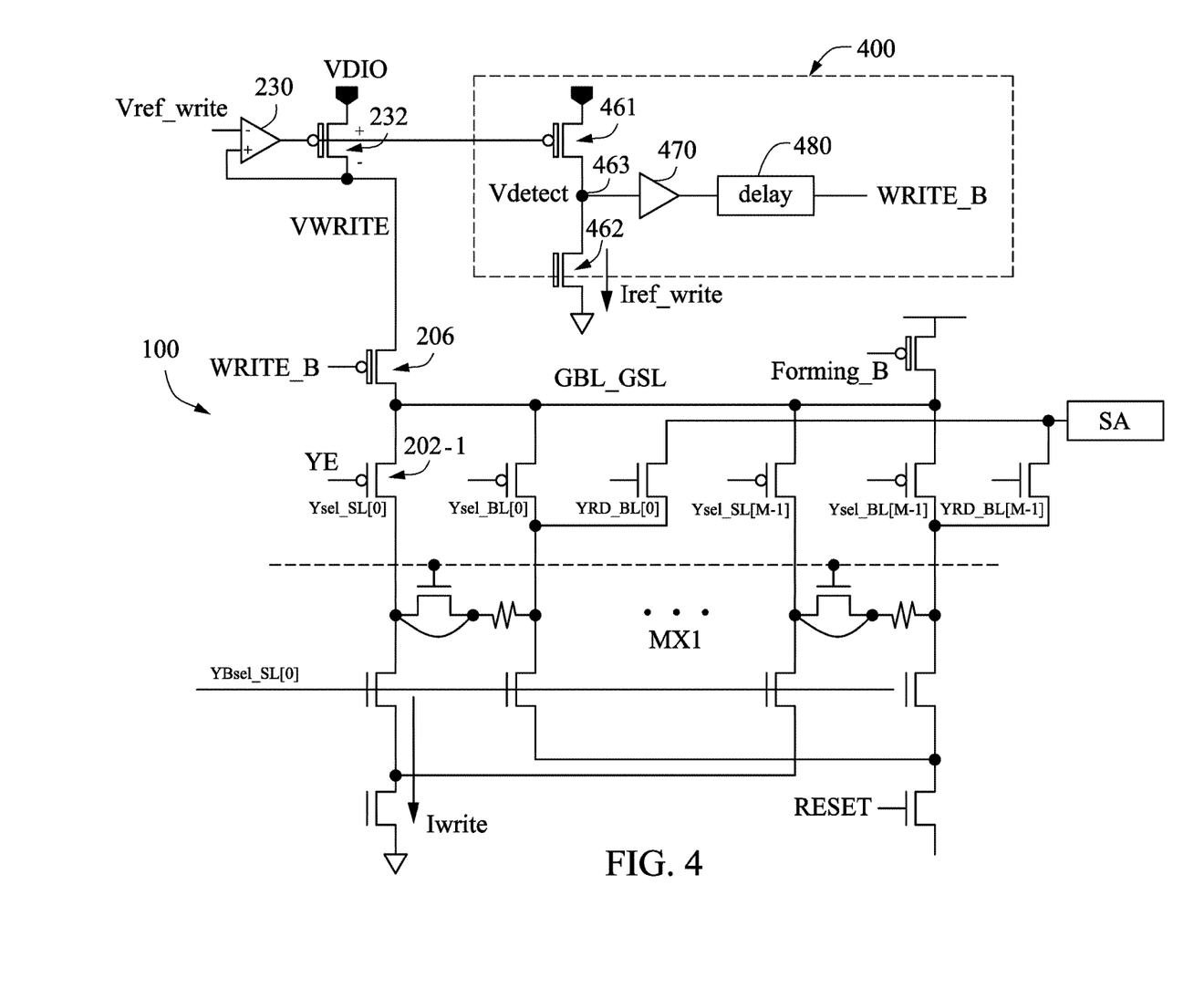
FIG. 4 illustrates an example write termination circuit for the memory cell array in accordance with some embodiments.

FIG. 4 illustrates an example write termination circuit 400 for the memory cell array 100 in accordance with some embodiments. The write termination circuit 400 is configured to write a RRAM resistive element 114 to a stable state and prevents over-SET/RESET. The write termination circuit 400 may be implemented with the memory cell array 100 in which access transistors 112 are bypassed via metal wiring 130 or removed to form a 0T1R array capable of low voltage operation as previously described. As shown in FIG. 4, the write termination circuit 400 includes a first transistor 461 (e.g., PMOS) and second transistor 462 (e.g., NMOS) connected in series with a node 463 therebetween to connect their respective drains. The source of the first transistor 461 is connected to power supply VDIO and the source of the second transistor 461 is connected to ground. The write termination circuit 400 also includes a buffer 470 with input to connected to the node 463 and output connected to a delay circuit 480 to provide a write termination signal WRITE_B.

The gate of the PMOS transistor 461 is connected to the output of op amp 230 of the regulated write voltage circuit 200. Accordingly, write termination circuit 400 is configured to generate a reference current Iref_write based on the write current Iwrite. After determining the RRAM resistive element 114 is written to a target value (e.g., based on a threshold voltage detected at node 462 using Iref_write) during a write operation, the write termination circuit 400 outputs the write termination signal WRITE_B to the gate of the write select transistor 206 to turn off the write operation by turning off the write select transistor 206. By using the threshold voltage at node 462 as a proxy for shutting off the write select transistor 206, the write termination circuit 400 advantageously writes the RRAM resistive element 114 to a stable state and prevents over-SET/RESET. Additionally, the write termination voltage has no head room overhead and does not increase write bias because it is based on a reference current Iref_write.

Figure 5:
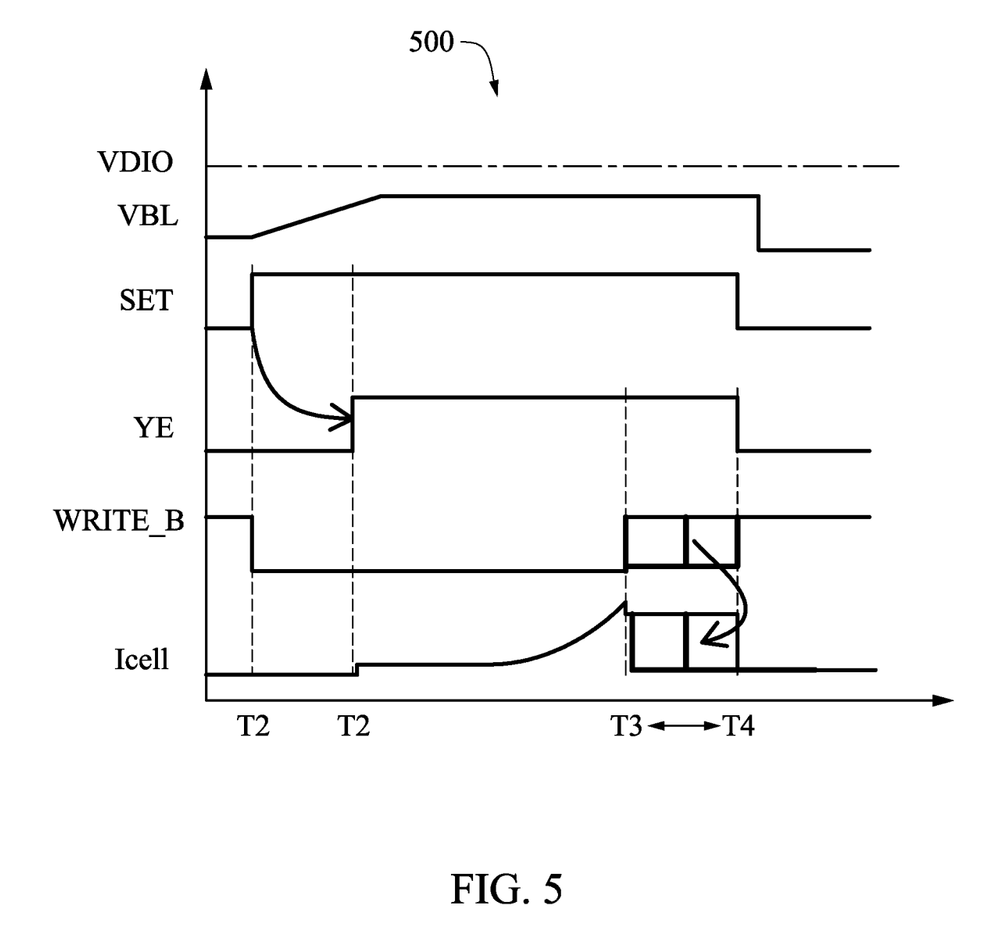
FIG. 5 is a timing diagram for the memory cell array incorporating the write termination circuit in accordance with some embodiments

FIG. 5 is a timing diagram 500 for the memory cell array 100 incorporating the write termination circuit 400 in accordance with some embodiments. At time T1, a SET operation is initiated. Thereafter, a column select signal YE received, for example, at the gate terminal of transistor 202-1 (see e.g., FIG. 4) of the selected memory cell is asserted at time T2, causing the RRAM resistive element 114 of the selected memory cell to receive (e.g., via SL and/or BL) a write current Icell that increases over time. At some point, time T3, the write termination circuit 400 detects the write current Icell has reached its target value (e.g., via Vdetect at node 463) and toggles the write termination signal WRITE_B (e.g., asserts a logic high) to the gate of the write select transistor 206 to turn off the write operation. Accordingly, the write current Icell is prevented from causing an over-SET/RESET for the RRAM resistive element 114.

Figure 6:
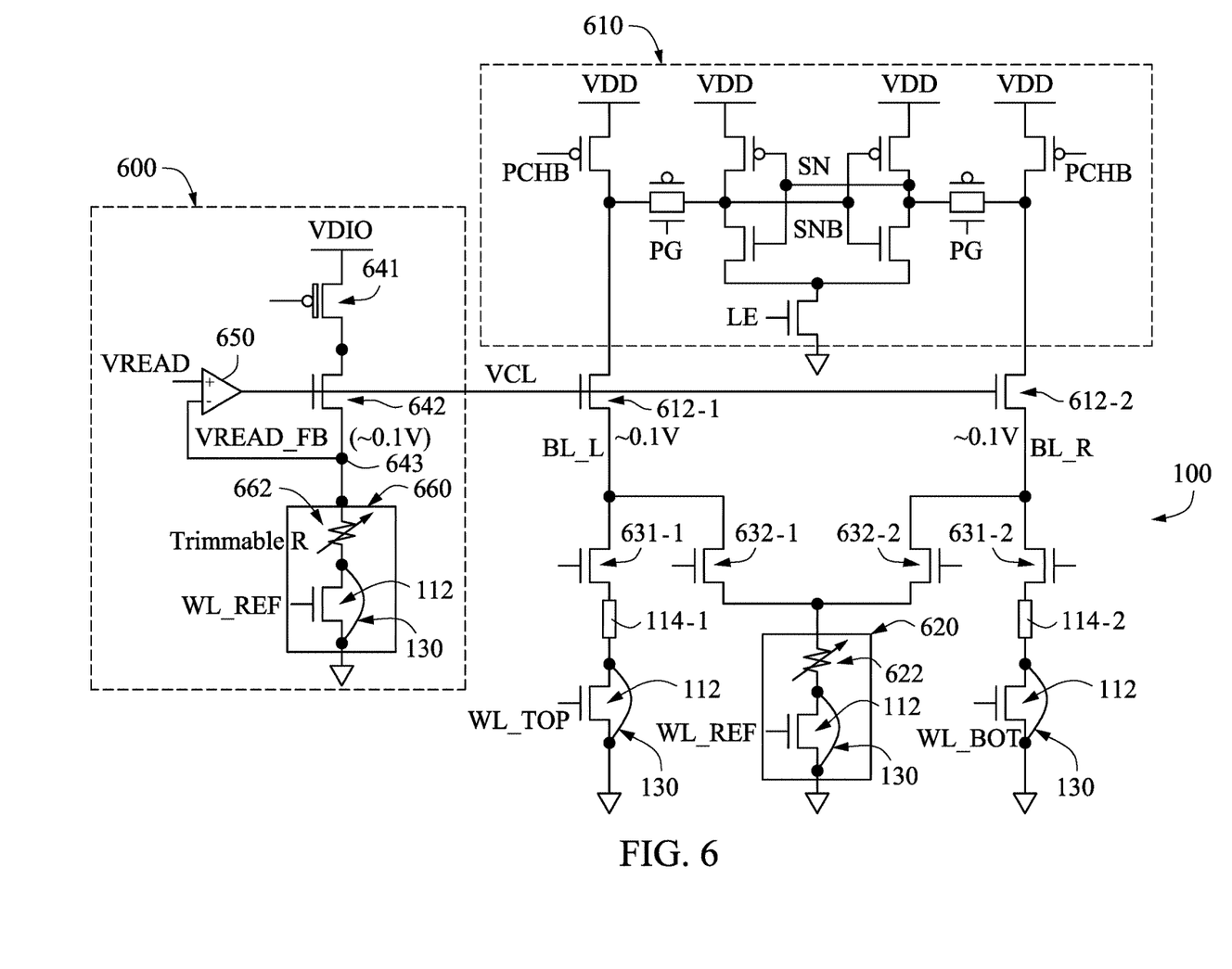
FIG. 6 illustrates an example low read voltage generator circuit for the memory cell array in accordance with some embodiments.

FIG. 6 illustrates an example low read voltage generator circuit 600 for a memory cell, such as the memory cell 110 of the memory cell array 100 in accordance with some embodiments. The low read voltage generator circuit 600 may be implemented with the memory cell array 100 in which access transistors 112 are bypassed via metal wiring 130 or removed to form a 0T1R array capable of low voltage operation as previously described. Additionally, as shown in FIG. 6, the memory cell array 100 may include one or more read paths (e.g., left/right RRAM cells and corresponding read paths via BL_L and BL_R) and a reference path which connect to a sense amplifier circuit 610 configured to read a bit value of a RRAM resistive element 114.

The memory cell array 100 may include clamping transistors 612, bit line (BL) read transistors 631, and reference select transistors 632 to connect a desired RRAM read path and reference path. For example, to read a left RRAM cell 114-1 of a left/right pair (114-1/114-2), a first BL read transistor 631-1 is turned on to connect the left RRAM cell to a first terminal of the sense amplifier circuit 610, and a second BL read transistor 631-2 is turned off. Additionally, a first reference select transistor 632-1 is turned off and a second reference select transistor 632-2 is turned on to connect a reference circuit 620 to a second terminal of the sense amplifier circuit 610. The right RRAM cell of the pair may be read using the opposite switch control. The reference circuit 620 includes a trimmable resistor 622 that is adjustable to emulate the selected RRAM cell. The reference circuit 620 may be operational with a 0T1R structure such as that described in conjunction with FIGS. 1C and 1D so that the sense amplifier circuit 610 is configured to track process, voltage, and temperature (PVT) variation of the read path of the memory cell array 100.

The low read voltage generator circuit 600 is connected to the gates of the clamping transistors 612 to control read voltage level for the selected left/right side. For example, a first clamping transistor 612-1 is connected between the first terminal of the sense amplifier circuit 610 and the left read path, and a second clamping transistor 612-2 is connected between the second terminal of the sense amplifier circuit 610 and the right read path. As described in greater detail below, the low read voltage generator circuit 600 is configured to maintain a low read voltage and avoid read disturb if the read voltage becomes too high.

The low read voltage generator circuit 600 includes a first transistor 641 (e.g., PMOS) with a first S/D terminal connected to the power supply VDIO and a second S/D terminal connected to a first S/D terminal of a second transistor 642 (e.g., NMOS). The second transistor 642 is arranged in a closed loop with an op amp 650. In particular, a first input (e.g., non-inverting input) of op amp 650 receives a read control voltage Vread from I/O circuitry (not shown). The output of op amp 650 is connected to the gate of the second transistor 642. The output of op amp 650 is also connected to the gates of the clamping transistors 612 to switch them on with its output clamping voltage VCL. The second transistor 642 includes a second S/D terminal connected, via node 643, to the second input (e.g., inverting input) of op amp 650 to form the closed loop.

The low read voltage generator circuit 600 also includes a reference circuit 660 connected between the node 643 and ground. The reference circuit 660 includes one or more trimmable resistors 662 to adjust the reference current to a desired value. Like the reference circuit 620 of the memory cell array 100, this second reference circuit 660 may be used with a 0T1R RRAM cell structure and adjust a trimmable resistor 662 so as to emulate the selected RRAM cell and track process, voltage, and temperature (PVT) variation of the read path of the memory cell array 100. In other words, the trimmable resistor 662 may be adjusted to compensate for PVT variations of the various components of the RRAM cell read path (e.g. BL, SL, access transistors, resistive element, etc. Due to the negative feedback loop, voltage at node 643 follows the read control voltage Vread. The low read voltage generator circuit 600 is thus configured to maintain a low read voltage (e.g., approximately 0.1V) and avoid read disturb if the read voltage becomes too high.

Figure 7A:
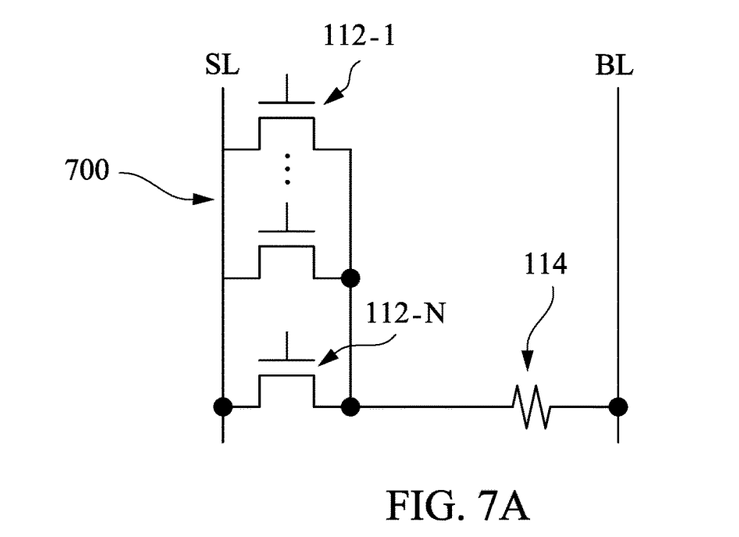
FIG. 7A illustrates an example parallel structure for reducing IR drop in accordance with some embodiments.
Figure 7B:
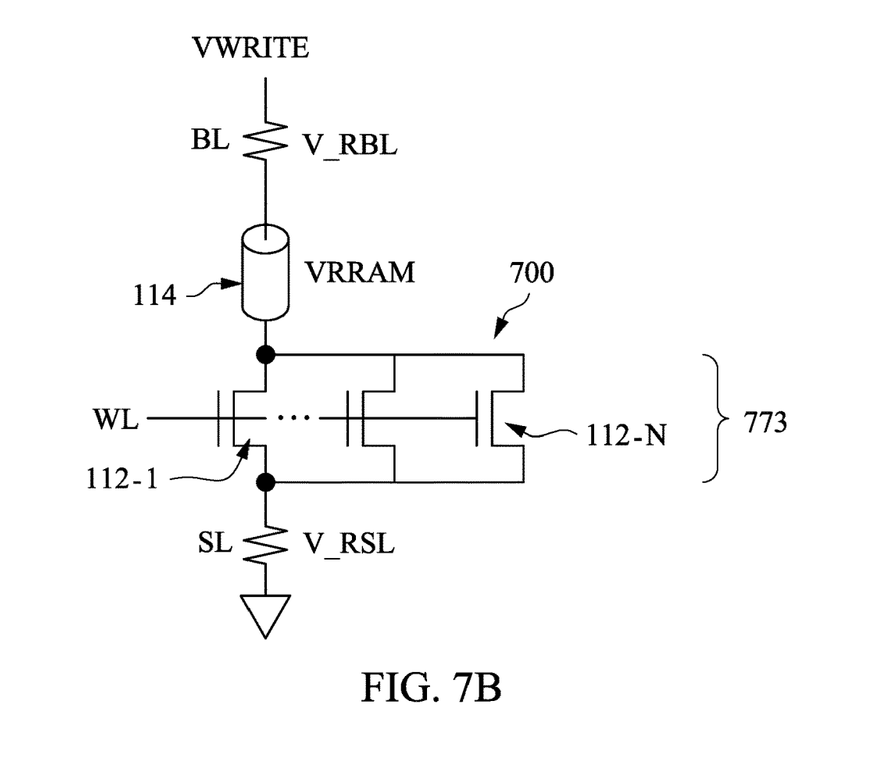
FIG. 7B is a schematic diagram of a write path for the parallel structure in accordance with some embodiments.

FIG. 7A illustrates an example parallel structure 700 for reducing IR drop in accordance with some embodiments. FIG. 7B is a schematic diagram of a write path for the parallel structure 700 in accordance with some embodiments. FIGS. 7A and 7B show an alternative structure to the 0T1R described in conjunction with FIGS. 1C and 1D for reducing the minimum operational write voltage. Rather than bypass or eliminate the access transistor 112 as shown in FIGS. 1C and 1D, an alternative access transistor arrangement is provided to reduce IR drop. In one embodiment, access transistors 112 (e.g., a row of access transistors 112-1 to 112-N) of the memory cell array 100 are arranged in parallel such that their gates are connected to a common word line (WL), their first S/D terminals are connected to a common terminal of a RRAM resistive element 114, and their second S/D terminals are connected to a common terminal of the select line (SL). The other terminal of the RRAM resistive element 114 is connected to the bit line (BL). Accordingly, the IR drop 773 associated with a single access transistor 112 is reduced by the use of multiple access transistors 112-1 . . . 112-N connected in parallel, thus reducing the minimum operation voltage while retaining the ability to perform write operations with WL control.

Figure 8:
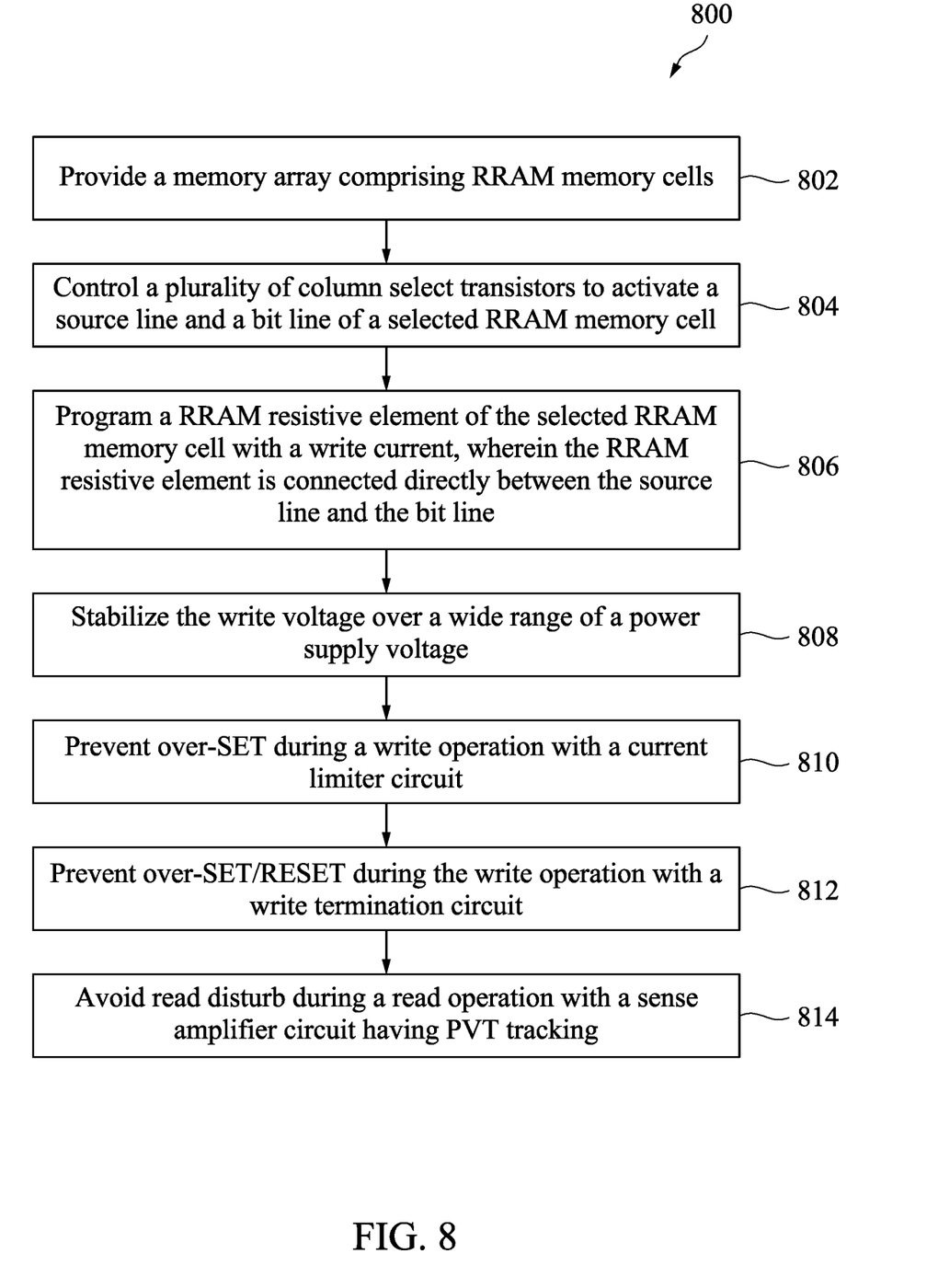
FIG. 8 illustrates an example method of reducing operating voltage of a memory device.

FIG. 8 illustrates an example method 800 of reducing operating voltage of a memory device. At operation 802, a memory array (e.g., memory cell array 100) is provided which comprises RRAM memory cells. At operation 804, a plurality of column select transistors 202/204 are controlled to activate a source line and a bit line of a selected RRAM memory cell. At operation 806, a RRAM resistive element 114 of the selected RRAM memory cell is programmed with a write current, wherein the RRAM resistive element 114 is connected directly between the source line and the bit line.

That is, IR drop typically associated with access transistors (e.g., access transistor 112) of the RRAM memory cells is reduced, and a write current/voltage may be generated for the RRAM memory cells that is reduced based on the reduced IR drop. In one embodiment, reducing the IR drop comprises connecting metal wiring 130 across source/drain terminals of the access transistors to bypass the access transistors. In another embodiment, reducing the IR drop comprises eliminating the access transistors from the RRAM memory cells. In yet another embodiment, reducing the IR drop comprises arranging the access transistors in a parallel structure.

At operation 808, the write voltage is stabilized (e.g., via regulated write voltage circuit 200) over a wide range of a power supply voltage. At operation 810, over-SET is prevented during a write operation with a current limiter circuit 300. At operation 812, over-SET/RESET is prevented during a write operation with a write termination circuit 400. At operation 814, read disturb is avoided (e.g., via low read voltage generator circuit 600) during a read operation with a sense amplifier circuit 610 having process, voltage, and temperature (PVT) tracking.

Accordingly, the various embodiments disclosed herein provide a memory device comprising an array of RRAM memory cells arranged in rows and columns, first column select transistors connected to a source line of each RRAM memory cell, and second column select transistors connected to a bit line of each RRAM memory cell, wherein each RRAM memory cell includes a RRAM resistive element connected directly between the source line and the bit line. In one embodiment, the memory device further includes metal wiring to connect across source/drain terminals of an access transistor of each RRAM memory cell, wherein the metal wiring bypasses the access transistor to directly connect the RRAM resistive element between the source line and the bit line. In another embodiment, there is no access transistor between the source line and the bit line for each RRAM memory cell.

In accordance with further disclosed embodiments, a method of reducing operating voltage of a memory device includes providing a memory array comprising RRAM memory cells, controlling a plurality of column select transistors to activate a source line and a bit line of a selected RRAM memory cell, and programming a RRAM resistive element of the selected RRAM memory cell with a write current, wherein the RRAM resistive element is connected directly between the source line and the bit line.

In accordance with other disclosed embodiments, a memory device comprises an array of RRAM memory cells arranged in rows and columns, each RRAM memory cell comprising: a resistive RRAM element including a first terminal connected to a bit line; and a plurality of access transistors arranged in a parallel structure and including first S/D terminals connected to a second terminal of the resistive RRAM element, second S/D terminals connected to a source line, and gate terminals connected to a word line, wherein the parallel structure of the plurality of access transistors reduces IR drop of a write current applied to the resistive RRAM element.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
an array of Resistive Random Access Memory (RRAM) memory cells arranged in rows and columns;
first column select transistors connected to a source line of each RRAM memory cell; and
second column select transistors connected to a bit line of each RRAM memory cell,
wherein each RRAM memory cell includes a RRAM resistive element connected directly between the source line and the bit line.

2. The memory device of claim 1, further comprising:
access transistors of the RRAM memory cells that connect between the source line and the bit line of each RRAM memory cell; and
metal wiring connected across source/drain terminals of the access transistors, wherein the metal wiring bypasses the access transistors to directly connect the RRAM resistive element of each RRAM memory cell between the source line and the bit line.

3. The memory device of claim 1, wherein there is no access transistor between the source line and the bit line for each RRAM memory cell.

4. The memory device of claim 1, further comprising a regulated write voltage circuit comprising:
an operational amplifier configured to receive a reference write voltage signal at a first input terminal; and
a write drive transistor including a gate terminal connected to an output of the operational amplifier, a first S/D terminal configured to receive a power supply voltage, and a second S/D terminal connected, via a node, to a second input terminal of the operational amplifier to form a positive feedback loop, wherein the node is operably connected to the bit line and the source line of a RRAM memory cell by a write select transistor.

5. The memory device of claim 1, further comprising a low voltage current limiter circuit comprising:
an operational amplifier configured to receive a reference voltage signal at a first input terminal;
a first transistor including a first gate terminal connected to an output of the operational amplifier, a first S/D terminal connected to a current mirror circuit, and a second S/D terminal connected, via a first node, to a second input terminal of the op operational amplifier to form a negative feedback loop; and
a second transistor including a third S/D terminal connected to the first node, a fourth S/D terminal connected to ground, and a second gate terminal connected, via a second node, to a third gate terminal of a bottom transistor of the array of RRAM memory cells,
wherein the second node is connected to the current mirror circuit,
wherein the output of the op amp is connected to a fourth gate terminal of a source line select transistor connected in series with the bottom transistor, and
wherein the low voltage current limiter circuit configured to control the source line select transistor and the bottom transistor to prevent over-SET of a selected RRAM memory cell.

6. The memory device of claim 1, further comprising a write termination circuit comprising:
a first transistor and a second transistor connected in series with a node therebetween to connect respective drain terminals, wherein a first gate terminal of the first transistor is connected to a regulated write voltage circuit for generating a reference write current; and
a buffer including an input to connect to the node and an output connected to a second gate terminal of a write select transistor of the array of RRAM memory cells, wherein the write termination circuit is configured to provide a write disable signal to the write select transistor in response to detecting a threshold value of a write operation to prevent over-SET/RESET.

7. The memory device of claim 1, further comprising a low read voltage generator circuit connected to a gate of a clamping transistor of a RRAM memory cell, the low read voltage generator circuit configured to control the clamping transistor to define a read voltage for the RRAM memory cell to avoid read disturb during a read operation with a sense amplifier circuit having process, voltage, and temperature (PVT) tracking.

8. The memory device of claim 1, wherein:
a word line and associated write circuitry is removed from the memory device.

9. The memory device of claim 1, further comprising a metal wiring connected across source/drain terminals of access transistors of the RRAM memory cells.

10. A method of reducing operating voltage of a memory device, comprising:
providing a memory array comprising Resistive Random Access Memory (RRAM) memory cells;
controlling a plurality of column select transistors to activate a source line and a bit line of a selected RRAM memory cell; and
programming a RRAM resistive element of the selected RRAM memory cell with a write current, wherein the RRAM resistive element is connected directly between the source line and the bit line.

11. The method of claim 10, further comprising:
providing a metal wiring across source/drain terminals of an access transistor of each RRAM memory cell, wherein the metal wiring bypasses the access transistor to directly connect the RRAM resistive element between the source line and the bit line.

12. The method of claim 10, further comprising:
removing an access transistor between the source and the bit line.

13. The method of claim 10, further comprising:
providing a reference write voltage signal at a first input terminal of an operational amplifier; and
generating a write voltage with a write drive transistor arranged in a positive feedback loop with the operational amplifier.

14. The method of claim 13, further comprising:
activating a write select transistor to provide the write current to the selected RRAM cell based on the write voltage.

15. The method of claim 14, further comprising:
providing a reference write current based on the reference write voltage signal;
detecting that a threshold value is reached during a write to the selected RRAM memory cell based on the reference write current; and
applying a write termination signal to the write select transistor in response to determining that the threshold value is reached to prevent over-SET of the selected RRAM memory cell.

16. The method of claim 13, further comprising:
providing a reference current with a current mirror circuit;
providing a reference write voltage signal at a first input terminal of an operational amplifier;
generating an output voltage with a first transistor arranged in a negative feedback loop with the operational amplifier;
generating a gate voltage with a second transistor connected in series with the first transistor and the current mirror circuit; and
applying the output voltage and the gate voltage respectively to a source line select transistor and a bottom transistor to limit the write current and prevent over-SET/RESET of the selected RRAM memory cell.

17. The method of claim 10, further comprising:
controlling a gate terminal of a clamping transistor of a RRAM memory cell to define a read voltage for the RRAM memory cell, and to avoid read disturb during a read operation with a sense amplifier circuit having process, voltage, and temperature (PVT) tracking.

18. A memory device, comprising:
- an array of Resistive Random Access Memory (RRAM) memory cells arranged in rows and columns, each RRAM memory cell comprising:
  - a resistive RRAM element including a first terminal connected to a bit line; and
  - a plurality of access transistors arranged in a parallel structure and including first S/D terminals connected to a second terminal of the resistive RRAM element, second S/D terminals connected to a source line, and gate terminals connected to a word line, wherein the parallel structure of the plurality of access transistors reduces IR drop of a write current applied to the resistive RRAM element, and wherein each RRAM memory cell includes a RRAM resistive element connected directly between the source line and the bit line.

19. The memory device of claim 18, wherein the parallel structure of the plurality of access transistors is disposed between the resistive RRAM element and the source line.

20. The memory device of claim 18, wherein gate terminals of the plurality of access transistors are connected together.

* * * * *